United States Patent
Ikeda

(10) Patent No.: US 8,507,356 B2
(45) Date of Patent: Aug. 13, 2013

(54) FORMATION OF WELLS UTILIZING MASKS IN MANUFACTURING SEMICONDUCTOR DEVICE

(75) Inventor: Noriaki Ikeda, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 92 days.

(21) Appl. No.: 13/297,414

(22) Filed: Nov. 16, 2011

(65) Prior Publication Data

US 2012/0135582 A1 May 31, 2012

(30) Foreign Application Priority Data

Nov. 25, 2010 (JP) .................................. 2010-262438

(51) Int. Cl.
*H01L 21/76* (2006.01)
*H01L 21/8238* (2006.01)

(52) U.S. Cl.
USPC ........... 438/423; 438/154; 438/199; 438/223; 438/224; 438/227; 438/228; 438/296; 438/298

(58) Field of Classification Search
USPC ................. 438/154, 199, 223, 224, 227, 228, 438/296, 298, 423; 257/E27.067
See application file for complete search history.

(56) References Cited

U.S. PATENT DOCUMENTS

| | | | | |
|---|---|---|---|---|
| 6,127,718 A | * | 10/2000 | Okayama et al. | 257/506 |
| 6,187,643 B1 | * | 2/2001 | Borland | 438/302 |
| 6,335,534 B1 | * | 1/2002 | Suguro et al. | 250/492.21 |
| 6,569,742 B1 | * | 5/2003 | Taniguchi et al. | 438/303 |
| 2006/0138568 A1 | * | 6/2006 | Taniguchi et al. | 257/408 |
| 2009/0075451 A1 | * | 3/2009 | Yoshie et al. | 438/401 |

FOREIGN PATENT DOCUMENTS

| | | |
|---|---|---|
| JP | 2000-58676 | 2/2000 |
| JP | 2003-347421 | 12/2003 |

* cited by examiner

*Primary Examiner* — Thanh V Pham
(74) *Attorney, Agent, or Firm* — Young & Thompson

(57) ABSTRACT

Semiconductor device manufacturing method includes forming a first mask, having a first opening to implant ion into semiconductor substrate and being used to form first layer well, on semiconductor substrate; forming first-layer well having first and second regions by implanting first ion into semiconductor substrate using first mask; forming second mask, having second opening to implant ion into semiconductor substrate and being used to form second layer well, on semiconductor substrate; and forming second-layer well below first layer well by implanting second ion into semiconductor substrate using second mask. First region is formed closer to an edge of first-layer well than second region. Upon implanting first ion, first ion deflected by first inner wall of first mask is supplied to first region. Upon implanting second ion, second ion deflected by second inner wall of second mask is supplied to second region.

20 Claims, 18 Drawing Sheets

US 8,507,356 B2

FORMATION OF WELLS UTILIZING MASKS IN MANUFACTURING SEMICONDUCTOR DEVICE

TECHNICAL FIELD

Reference to Related Application

This application is based upon and claims the benefit of the priority of Japanese patent application No. 2010-262438, filed on Nov. 25, 2010, the disclosure of which is incorporated herein in its entirety by reference thereto.

The present invention relates to a semiconductor device and method for manufacturing the same.

BACKGROUND

A semiconductor device such as a DRAM (Dynamic Random Access Memory) uses a triple-well structure in which three layers of wells are formed on a semiconductor substrate. For instance, the triple-well structure comprises a P-type semiconductor substrate, an N-type well (referred to as "deep N-well" hereinafter) formed on the P-type semiconductor substrate, and a P-type well (referred to as "P-well" hereinafter), electrically isolated from the P-type semiconductor substrate, in the N-type well (for instance, refer to Patent Documents 1 and 2).
[Patent Document 1]
Japanese Patent Kokai Publication No. JP-P2000-058676A
[Patent Document 2]
Japanese Patent Kokai Publication No. JP-P2003-347421A

SUMMARY

The entire disclosures of the above Patent Documents are incorporated herein by reference thereto. The following analysis is given from the standpoint of the present invention.

In a DRAM, a sense amplifier is connected to each bit line in order to amplify a potential difference between the bit lines corresponding to memory data.

FIG. 15 shows a schematic diagram illustrating the memory cell layout of a general DRAM. The DRAM has a plurality of memory cell regions MCA arranged in a matrix, sub-word regions SWD provided between the memory cell regions MCA adjoining in the X-direction, and sense amplifier regions SAA provided between the memory cell regions MCA adjoining in the Y-direction. Here, the X-direction is the extending direction of sub-word lines SWL and matches the longitudinal direction of the sense amplifier regions SAA shown in FIG. 15. Further, the Y-direction is the extending direction of bit lines BL and matches the longitudinal direction of the sub-word regions SWD.

FIG. 16 shows an equivalent circuit of a memory cell. A plurality of memory cells MC (for instance, 256,000 of them) are arranged in the memory cell region MCA. As shown in FIG. 16, a memory cell MC is constituted by a cell transistor Tr and a cell capacitor C connected in series between the bit line BL and a plate potential supply line PL. A gate electrode of the cell transistor Tr is connected to a corresponding sub-word line SWL. As a result, when the sub-word line SWL goes to a high level, the corresponding cell transistor Tr turns on and the cell capacitor C is electrically connected to the corresponding bit line BL.

When data is written to the memory cell MC, a high-level writing potential VARY (for instance, 1.3V) or a low-level writing potential VSSA (for instance, 0V) is supplied to the cell capacitor C, depending on the stored data.

On the other hand, when data is read from the memory cell MC, the cell transistor Tr is turned on after the bit line BL is precharged to an intermediate potential, i.e., a midpoint potential between VARY and VSSA (for instance, 0.65V). As a result, when the high-level writing potential VARY is written to the cell capacitor C, the potential of the bit line BL increases slightly from the intermediate potential, and when the low-level writing potential VSSA is written to the cell capacitor C, the potential of the bit line BL decreases slightly from the intermediate potential.

The driving of the bit line BL accompanying such data write and data read is performed by a sense amplifier SA disposed in the sense amplifier region SAA.

FIG. 17 shows a schematic diagram of a region P including the sense amplifiers shown in FIG. 15. As shown in the diagram, many sense amplifiers SA (four sense amplifiers SA0 to SA03 are shown in FIG. 17) are provided in the sense amplifier region SAA, and each sense amplifier SA is connected to a pair of the bit lines BL extending in the Y-direction within the memory cell regions adjoining in the Y-direction. In order to support high-integrated DRAMs, a sense amplifier connection method called the "open bit line architecture" has become a mainstream in recent years. In this open bit line architecture, each sense amplifier SA is connected to a pair of the bit lines BL, separately extending within two memory cell regions MCA adjoining in directions different from each other (the upward and downwards directions in FIG. 17), viewed from the sense amplifier SA. In FIG. 17, a pair of the bit lines BL connected to the sense amplifier SAi (i=an integer from 0 to 3) are shown as bit lines BiT and BiB. Note that "T" denotes "true" and "B" "complementary."

In the open bit line architecture, every other bit line BL in each memory cell region MCA is connected to a sense amplifier SA in the sense amplifier region SAA, as shown in FIG. 17. The bit lines BL not connected to any sense amplifier SA are connected to sense amplifiers SA in the sense amplifier regions SAA located on the other sides of these memory cell regions MCA.

FIG. 18 shows a concrete circuit configuration of the sense amplifier SA0. The other sense amplifiers SA1 to SA3 have the same circuit configuration. The sense amplifier SA has four nodes, i.e., a pair of power supply nodes a and b, and a pair of signal nodes c and d. The power supply node a is connected to a high-level drive wiring VP, and the power supply node b is connected to a low-level drive wiring VN. Further, the signal nodes c and d are connected to the corresponding bit line pair B0T and B0B, respectively. The sense amplifier SA is activated by supplying the aforementioned high-level writing potential VARY and the low-level writing potential VSSA to the high-level drive wiring VP and the low-level drive wiring VN, respectively.

Further, the sense amplifier SA has P-channel MOS transistors Tr1 and Tr2 and N-channel MOS transistors Tr3 and Tr4. The transistors Tr1 and Tr3 are connected in series between the power supply nodes a and b, a connection point between the two transistors is connected to the signal node d, one of the signal nodes, and gate electrodes thereof are connected to the signal node c, the other signal node. Similarly, the transistors Tr2 and Tr4 are connected in series between the power supply nodes a and b, a connection point between the two transistors is connected to the signal node c, one of the signal nodes, and gate electrodes thereof are connected to the signal node d, the other signal node.

When a write or read operation is performed on the memory cell MC, a potential difference occurs between the bit line pair B0T and B0B. When the potential of the bit line B0T is higher than that of the bar bit line B0B, the transistors Tr2 and Tr3 turn on and the transistors Tr1 and Tr4 turn off. As a result, the power supply node a and the signal node c are connected and the high-level writing potential VARY is supplied to the bit line B0T. Further, the power supply node b and the signal node d are connected and the low-level writing potential VSSA is supplied to the bar bit line B0B.

On the other hand, when the potential of the bit line B0T is lower than that of the bar bit line B0B, the transistors Tr1 and Tr4 turn on and the transistors Tr2 and Tr3 turn off. As a result, the power supply node a and the signal node d are connected and the high-level writing potential VARY is supplied to the bar bit line B0B. Further, the power supply node b and the signal node c are connected and the low-level writing potential VSSA is supplied to the bit line B0T.

The sense amplifiers perform amplification operation as described above.

However, since the potential differences between the bit lines are very small, the sense amplifier needs to have high sensitivity. As evident from the operation of the sense amplifier described above, it is crucial that a pair of the P-channel transistors Tr1 and Tr2 have equal operating characteristics (the threshold voltage, etc.) and that a pair of the N-channel transistors Tr3 and Tr4 have equal operating characteristics for the sake of improving the operating sensitivity.

In response to the miniaturization of semiconductor devices in recent years, the gate lengths of transistors have decreased, and it is more likely to have variations in the operating characteristics among transistors. Particularly, P-channel transistors tend to exhibit a short-channel effect and are more likely to have variations in the operating characteristics than N-channel transistors. As a result, in the DRAM relating to the background art, the sensitivity of the sense amplifier is likely to decrease due to unbalance in the operating characteristics of the P-channel transistors Tr1 and Tr2 disposed as a pair in the sense amplifier circuit. When the sensitivity of the sense amplifier decreases, so does the manufacturing yield of semiconductor devices.

The present inventor has discovered that one of the causes for variations in the operating characteristics of a pair of MOS transistors constituting a sense amplifier circuit, especially P-channel MOS transistors ("PMOS" hereinafter), is a problem with the method for forming an N-type well ("N-well" hereinafter). First, the content thereof will be described.

FIG. 8 shows a schematic plan of the layout of the MOS transistors constituting the sense amplifier. In order to reduce the footprint of the sense amplifier region SAA, the N-channel MOS transistors ("NMOS" hereinafter) are disposed together in a center region (SAN region) in FIG. 8. SAP regions are provided above and below the SAN region, and PMOS are disposed therein. An active region 941 of each transistor has the periphery thereof compartmentalized by an element isolation region such as STI. The active regions 941 located on both sides of a gate electrode 948 of each transistor become source/drain electrodes.

Both NMOS and PMOS are disposed in such a manner that they share one of the source/drain electrodes of an adjacent transistor for the sake of reducing the footprint. A contact plug 949 is disposed in the shared part of the source/drain electrodes and a predetermined potential is supplied to each of PMOS and NMOS via wiring not shown in the drawing. FIG. 8 only shows four bit lines: B0T, B0B, B1T, and B1B. Black circles shown on the bit lines indicate that these bit lines are connected to the gate electrode or the source/drain electrodes underneath via the contact plug.

A Y-switch circuit for controlling the input/output of signals to/from the sense amplifier and a precharge circuit for the bit line are disposed in the sense amplifier region SAA, in addition to the sense amplifier circuit shown in FIG. 8. These circuits, other than the sense amplifiers, are generally constituted by NMOS.

FIG. 9 shows a schematic cross section of a semiconductor device along line IX-IX in FIG. 17. FIG. 9 shows the placement of wells in the sense amplifier region SAA as well as parts of the memory cell regions MCA. The semiconductor device 900 has the SAN region where NMOS of the sense amplifier circuit are disposed, the SAP region where PMOS of the sense amplifier circuit are disposed, a YN region where circuits other than the sense amplifier circuit, such as the Y-switch circuit, are disposed, and the MCA region where memory cells are formed.

In a first layer of a P-type semiconductor substrate 901, a first P-well 921 is formed in the SAN region, an N-well 924 is formed in the SAP region, a second P-well 922 is formed in the YN region, and a third P-well 923 is formed in the MCA region. Between regions, an element isolation region 931 is formed, and NMOS (not shown in FIG. 9) are formed in the MCA and YN regions. In a second layer of the P-type semiconductor substrate 901, a deep N-type well (referred to as "deep N-well" hereinafter) 911 is formed. The deep N-well 911 is formed below the MCA and YN regions and in such a manner that an end thereof contacts an end of the N-well 924 in the SAP region.

The potential of the third P-well 923 can be set independently of the semiconductor substrate 901 by disposing the third P-well 923 in the MCA region above the deep N-well 911. A transistor having the shortest gate length in the semiconductor device 900 is disposed in the MCA region, and the operation of the transistor disposed in the MCA region can be optimized by adjusting a bias applied to the third P-well 923.

A potential different from that of the third P-well 923 in the MCA region can be applied to the first P-well 921 in the SAN region by disposing the first P-well 921 in a region outside the deep N-well 911. As a result, threshold voltage increases dependent on the well potential can be suppressed, and the circuit operating characteristics of the sense amplifier can be improved.

The N-well 924 in the SAP region also has a function of electrically isolating the first P-well 921 in the SAN region from the second P-well 922 in the YN region. The footprint of the sense amplifier region SAA can be reduced by giving the N-well 924 in the SAP region the function of separating the neighboring P-wells 921 and 922 while using the N-well 924 as an N-well for PMOS.

FIG. 10 shows an enlarged view of a part of the SAN region and the SAP region in a range indicated by "R" in FIG. 8. As far as the bit lines are concerned, only B1T and B1B are shown. The SAN region is disposed in the first P-well 921, and the active region 941 of each NMOS is compartmentalized by the element isolation region 931. In the first P-well 921, a P-type impurity diffusing region (referred to as "P-well-con region" hereinafter) 944 for connecting a contact plug for fixing potential is provided.

The SAP region is disposed in the N-well 924, and the active region 941 of each PMOS is compartmentalized by the element isolation region 931. In the N-well 924, an N-type impurity diffusing region (referred to as "N-well-con region" hereinafter) 943 for connecting a contact plug for fixing potential is provided. In order to prevent latch-up, the P-well-con region 944 and N-well-con region 943 are generally arranged linearly, facing each other.

FIG. 11 shows a schematic cross section along line XI-XI in FIG. 10. Each well is formed by implanting a predetermined dose of impurity into the semiconductor substrate, using ion implantation. Here, problems caused by the process of ion implantation for forming the N-well 924 will be explained.

The N-well 924 has a first active region 941a, a second active region 941b, and the N-well-con region 943, from left to right. Each region is compartmentalized by the element isolation region 931. The deep N-well 911 extends below the second P-well and reaches the N-well-con region 943 of the N-well 924, but it does not extends to the underneath of the first active region 941a and the second active region 941b.

FIG. 12 shows a schematic cross section for explaining the method for forming the deep N-well in the semiconductor device shown in FIG. 11. FIG. 12 shows a state in which the deep N-well 911 and the N-well 924 have not been formed yet. A first photoresist film 945 which does not cover a region where the deep N-well 911 will be formed is formed on the semiconductor substrate 901. The first photoresist film 945 is used as a mask for ion implantation. In FIG. 12, the first photoresist film is formed so as to mask the first active region 941a and the second active region 941b and to expose the N-well-con region 943. The deep N-well 911 is formed by implanting, for instance, phosphorus ion ($P^+$) as an impurity for the N-well.

FIG. 12 schematically shows the process of the ion implantation when the deep N-well 911 is formed. In order to form the deep N-well of a predetermined depth, the ion implantation is performed at a relatively high energy level of 900 keV to 1000 keV. The first photoresist film 945 used as a mask is formed to be thick enough to stop this high-energy N-type second ion Q1 and Q2. As a result, a side 945a of the first photoresist film is likely to become an upward-facing slope (tapered in a case of an opening).

The N-type second ion Q1 (indicated by white arrows) implanted into regions other than the first photoresist film 945 is directly injected into the semiconductor substrate 901. Meanwhile, the N-type second ion Q2 (indicated by black arrows) implanted into the first inner wall surface 945a of the first photoresist film 945 is deflected by the first inner wall surface 945a and reaches the surface of the semiconductor substrate 901. The second ion Q2 reaching the surface of the semiconductor substrate 901 loses energy due to this deflection and therefore stays near the surface of the semiconductor substrate 901. Due to the deflection phenomenon on the first inner wall surface 945a of the first photoresist film 945, the amount of the ion implanted into the semiconductor substrate 901 increases towards the first inner wall surface 945a of the first photoresist film 945.

At this time, since the first active region 941a and the second active region 941b are covered by the first photoresist film 945, the second ion Q2 deflected by the first inner wall surface 945a is not supplied to the first active region 941a and the second active region 941b.

FIG. 13 shows a schematic cross section for explaining the method for forming the N-well in the semiconductor device shown in FIG. 11. FIG. 13 shows a state in which the deep N-well has been formed. On the semiconductor substrate 901, a second photoresist film 946, having an opening in a region where the N-well 924 will be formed, is formed. The second photoresist film 946 is used as a mask for ion implantation. The N-well 924 is formed by implanting, for instance, phosphorus ion ($P^+$) as an impurity for the N-well.

FIG. 13 schematically shows the process of the ion implantation when the N-well 924 is formed. In order to form the N-well of a predetermined depth, the ion implantation is performed at a relatively high energy level of 300 keV to 400 keV. Since the second photoresist film 946 used as a mask is formed to be thick enough to stop this high-energy N-type first ion Q3 and Q4, an inner wall surface 946a (a second side) of the opening is likely to be tapered as shown in FIG. 13.

The N-type first ion Q3 (indicated by white arrows) implanted into the opening region of the second photoresist film 946 is directly injected into the semiconductor substrate 901. Meanwhile, some of the N-type first ion Q4 (indicated by black arrows) implanted into the second side 946a of the second photoresist film 946 is deflected by the second side 946a of the second photoresist film 946 and reaches the surface of the semiconductor substrate 901, particularly the first active region 941a. The N-type first ion Q4 reaching the surface of the first active region 941a loses energy due to this deflection and therefore stays near the surface of the first active region 941a. Due to the deflection phenomenon on the second side 946a of the second photoresist film 946, the amount of the ion implanted into the semiconductor substrate 901 increases towards the second side 946a of the second photoresist film 946.

FIG. 14 shows a schematic cross section after the N-well has been formed in the semiconductor device shown in FIG. 11. In FIG. 14, the first active region 941a of PMOS on the left is disposed at a position a first distance d1 away from the left end of the opening of the second photoresist film 946. Meanwhile, the second active region 941b of PMOS on the right is disposed at a position a third distance d3 away from the left end of the opening of the second photoresist film 946. Since the first active region 941a is interposed between the left end of the opening and the second active region 941b, the third distance d3 is naturally greater than the first distance d1.

Further, in FIG. 14, the N-type impurity diffusing region 943 for the N-well-con is interposed between the second active region 941b of PMOS on the right and the right end of the opening of the second photoresist film 946, and the N-type impurity diffusing region 943 for the N-well-con is disposed at a position a second distance d2 away from the right end of the opening. The second active region 941b of PMOS on the right is disposed at a position a fourth distance d4 away from the right end of the opening of the second photoresist film 946. Since the first distance d1 and the second distance d2 are set at approximately the same length, the fourth distance d4 is greater than the first distance d1.

Therefore, when the ion is implanted to form the N-well 924, due to the deflection on the second side 946a of the second photoresist film 946, a larger amount of the N-type first ion is implanted into the first active region 941a on the left than the second active region 941b on the right. As a result, the N-type impurity concentration in a channel region of PMOS in the first active region 941a increases and the threshold voltage (the absolute value) rises. Since PMOS in the first active region 941a and PMOS in the second active region 941b constitute the sense amplifier circuit as a pair, the operating sensitivity of the sense amplifier decreases if an imbalance of the threshold voltage occurs such as when one of PMOSs is higher than the other.

As describe above, the sense amplifier circuit shown in FIG. 9 is prone to unbalance of the threshold voltage due to the position of PMOS in the N-well.

One of means for avoiding this problem is to enlarge the width of the N-well 924 and increase the first distance d1 from the first active region 941a on the left to the second photoresist film 946 in FIG. 14. This means, however, will increase the footprint of the sense amplifier circuit thereby increasing the size of the semiconductor device (semiconductor chip).

According to a first aspect of the present invention, there is provided a method for manufacturing a semiconductor device, including forming a first mask on a semiconductor substrate, the first mask having a first opening to implant ion into the semiconductor substrate and being used to form a first layer well; forming the first layer well having first and second regions by implanting first ion into the semiconductor substrate using the first mask; forming a second mask on the semiconductor substrate, the second mask having a second opening to implant ion into the semiconductor substrate and being used to form a second layer well; and forming the second layer well located below the first layer well by implanting second ion into the semiconductor substrate using the second mask. The first region is formed closer to an outer edge of the first layer well than the second region. When the first ion is implanted, the first ion, deflected by a first inner wall surface of the first opening of the first mask, is supplied to the first region. When the second ion is implanted, the second ion, deflected by a second inner wall surface of the second opening of the second mask, is supplied to the second region.

According to a second aspect of the present invention, there is provided a method for manufacturing a semiconductor device, including forming a first mask on a semiconductor substrate, the first mask having a first opening to implant ion into the semiconductor substrate and being used to form a first layer well; forming a first layer well having first and second regions used to form a pair of MOS transistors by implanting first ion into the semiconductor substrate using the first mask as a mask; forming a second mask on the semiconductor substrate, the second mask having a second opening to implant ion into the semiconductor substrate and being used to form a second layer well; and forming a second layer well located below the first layer well by implanting second ion into the semiconductor substrate using the second mask as a mask. The first mask is formed in such a manner that the first ion, deflected by a first inner wall surface of the first opening of the first mask, is supplied to the first region. The second mask is formed in such a manner that the second ion, deflected by a second inner wall surface of the second opening of the second mask, is supplied to the second region.

According to a third aspect of the present invention, there is provided a method for manufacturing a semiconductor device, comprising providing a semiconductor substrate having a first, a second and a third regions, the first, the second and the third regions arranged in that order on a line; forming a first mask on the semiconductor substrate, the first mask having a first opening; implanting first ion into the first, the second and the third regions to form a first layer well using the first mask, so that the first and the third regions also include the first ion deflected by a first inner wall surface of the first opening of the first mask; forming a second mask on the semiconductor substrate, the second mask having a second opening; and implanting second ion into the second and third regions to form a second layer well using the second mask, so that the second region also includes the second ion deflected by a second inner wall surface of the second opening of the second mask.

According to a fourth aspect of the present invention, there is provided a semiconductor device comprising a semiconductor substrate, a first layer well formed in a first layer of the semiconductor substrate, and a second layer well formed in a second layer of the semiconductor substrate. The first layer well has a second region and a first region located closer to an outer edge of the first layer well than the second region. The second layer well extends below at least the second region. At least a part of the second layer well is located closer to an end of the second region than to the outer edge of the first layer well.

The meritorious effects of the present invention are summarized as follows. The present invention has at least one of the following effects.

In the method for manufacturing a semiconductor device, ion deflected by a side of a mask is supplied to both the first and the second regions. As a result, compared to a case where ion deflected by a side of a mask is supplied only to one of the regions, the difference in ion concentration between the first and the second regions can be made smaller. Consequently, when a MOS transistor is formed in each of the first and the second regions, the difference in the threshold voltage between the MOS transistors can be kept to a minimum. When the transistors are used in a sense amplifier circuit, the occurrence of an unbalance in the operating characteristics of the sense amplifier circuit can be suppressed. As a result, a semiconductor device exhibiting higher performance can be manufactured.

In the semiconductor device of the present invention, ion is implanted during the manufacturing process in such a manner that the difference in ion concentration between the first and the second regions is kept to a minimum. As a result, according to the semiconductor device of the present invention, a sense amplifier circuit having a small threshold voltage unbalance and high operating sensitivity can be constituted.

PREFERRED MODES

Figure 1:
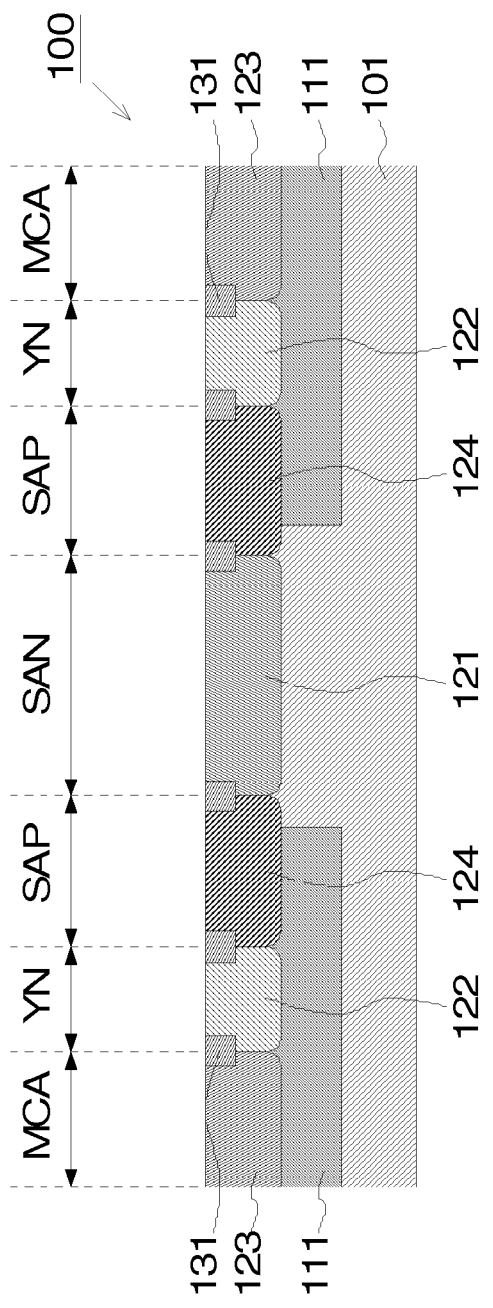
FIG. 1 is a schematic cross section of a semiconductor device according to a first exemplary embodiment of the present invention.

Preferred modes of each aspect will be described.

According to a preferred mode of the first aspect, the second layer well is formed in such a manner that at least a part of an end of the second layer well is located closer to an end of the second region than to the outer edge of the first layer well.

According to a preferred mode of the first aspect, the method for manufacturing a semiconductor device further includes forming an element isolation region that compartmentalizes the second region from other regions on a layer in which the first layer well is formed. The second layer well and the element isolation region are formed in such a manner that at least a part of the end of the second layer well is located below a region where the element isolation region is formed.

According to a preferred mode of the second aspect, the first region is formed closer to an outer edge of the first layer well than the second region.

According to a preferred mode of the first aspect and the second aspect, the second mask is formed in such a manner that at least a part of the second inner wall surface of the second mask is located closer to an end of the second region than an outer edge of the first layer well.

According to a preferred mode of the first aspect and the second aspect, the method for manufacturing a semiconductor device further includes forming an element isolation region that compartmentalizes the second region from other regions on a layer in which the first layer well is formed. The second mask and the element isolation region are formed in such a manner that at least a part of the second inner wall surface of the second mask is located on a region where the element isolation region is formed.

According to a preferred mode of the first aspect and the second aspect, the second mask is formed so as to cover the first region.

According to a preferred mode of the first aspect and the second aspect, the first inner wall surface of the first opening of the first mask is tapered, facing upward.

According to a preferred mode of the first aspect and the second aspect, the second inner wall surface of the second opening of the second mask is tapered, facing upward.

According to a preferred mode of the first aspect and the second aspect, the method for manufacturing a semiconductor device further includes forming a first MOS transistor in the first region, forming a second MOS transistor in the second region, and forming a sense amplifier circuit having the first MOS transistor and the second transistor as a pair of MOS transistors.

According to a preferred mode of the first aspect and the second aspect, the first ion and the second ion are the same ion.

According to a preferred mode of the third aspect, the first region is formed closer to an outer edge of the first layer well than the second region.

According to a preferred mode of the third aspect, the third region is formed closer to an outer edge of the first layer well than the second region.

According to a preferred mode of the third aspect, the second mask is formed in such a manner that at least a part of the second inner wall surface of the second mask is located closer to an end of the second region than an outer edge of the first layer well.

According to a preferred mode of the third aspect, the method further comprises forming an element isolation region that compartmentalizes the second region from other regions on a layer in which the first layer well is formed. The second mask and the element isolation region are formed in such a manner that at least a part of the second inner wall surface of the second mask is located in a region where the element isolation region is formed.

According to a preferred mode of the third aspect, the first inner wall surface of the first opening of the first mask is tapered, facing upward.

According to a preferred mode of the third aspect, the second inner wall surface of the second opening of the second mask is tapered, facing upward.

According to a preferred mode of the third aspect, the method further comprises forming a first MOS transistor in the first region; forming a second MOS transistor in the second region; forming a sense amplifier circuit having the first MOS transistor and the second transistor as a pair of MOS transistors; and forming a contact plug for fixing potential in the third region.

According to a preferred mode of the fourth aspect, the semiconductor device further comprises an element isolation region that compartmentalizes the second region from other regions. At least a part of the end of the second layer well is located below the element isolation region.

According to a preferred mode of the fourth aspect, the semiconductor device further comprises a first MOS transistor formed in the first region, and a second MOS transistor formed in the second region. The first MOS transistor and the second transistor are a pair of MOS transistors constituting a sense amplifier.

According to a preferred mode of the fourth aspect, the first layer well further has a third region. The first region, the second region, and the third region are arranged in this order in the first layer well. The second layer well extends below the third region and the second region. At least a part of an end of the second layer well is located closer to a boundary between the first region and the second region than to the outer edge of the first layer well.

According to a preferred mode of the fourth aspect, the first layer well further has a third region. The first region, the second region, and the third region are arranged in this order in the first layer well. The second layer well extends below the first region and the second region. At least a part of an end of the second layer well is located closer to a boundary between the second region and the third region than to the outer edge of the first layer well.

According to a preferred mode of the fourth aspect, the first layer well and the second layer well have the same conductivity type.

Figure 9:
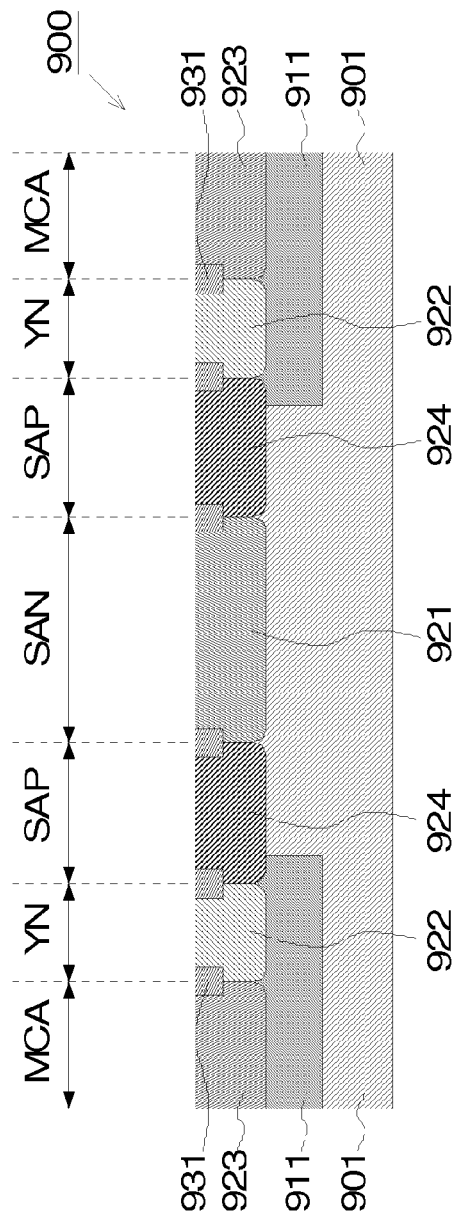
FIG. 9 is a schematic cross section of a semiconductor device along line IX-IX in FIG. 17.
Figure 10:
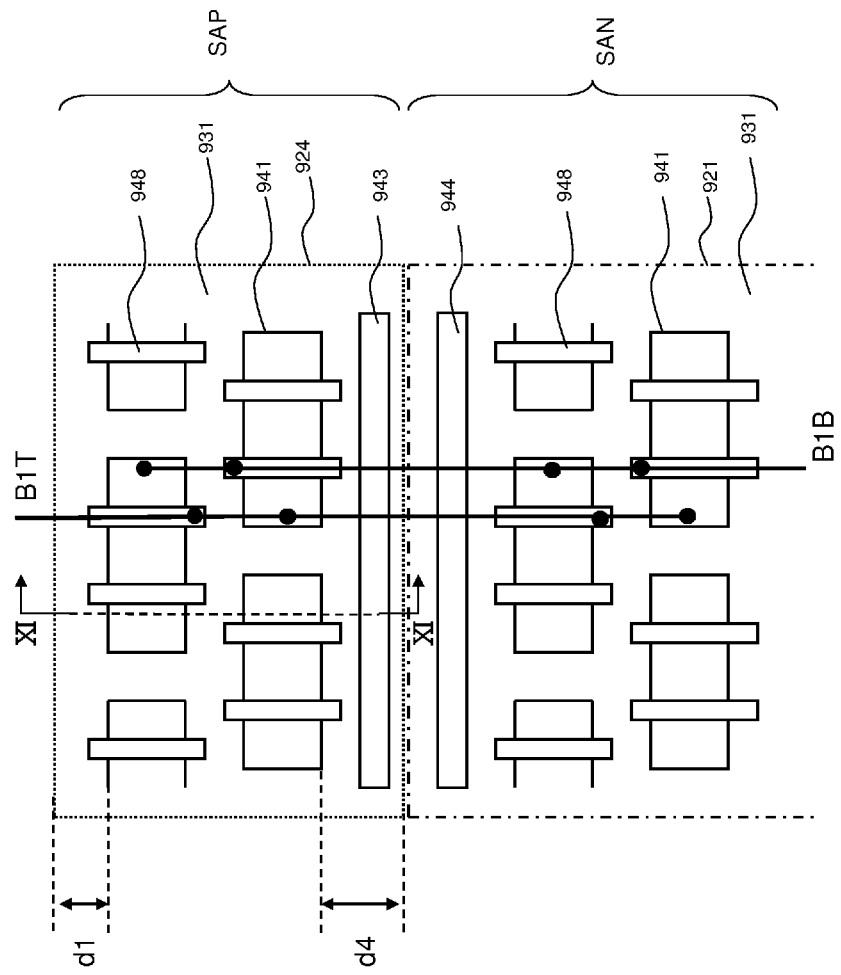
FIG. 10 is an enlarged view of a part of a SAN region and a SAP region in a range indicated by "R" in FIG. 8.

A semiconductor device according to a first exemplary embodiment of the present invention will be described. FIG. 1 shows a schematic cross section of the semiconductor device according to the first exemplary embodiment of the present invention. FIG. 1 is a drawing corresponding to FIG. 9.

The semiconductor device 100 has a triple-well structure. The semiconductor device 100 comprises a P-type semiconductor substrate 101 and a deep N-well 111 formed in a second layer. The semiconductor device 100 further comprises a first P-well 121, a second P-well 122, a third P-well 123, and an N-well 124 formed in a first layer. The first P-well 121 is adjacent to the N-wells 124. The N-well 124 is adjacent to the second P-well 122. The second P-well 122 is adjacent to the third P-well 123. Here, the third P-well 123 becomes the MCA region; the second P-well 122 becomes the YN region; the N-well 124 becomes the SAP region; and the first P-well 121 becomes the SAN region. Each region is compartmentalized by an element isolation region 131.

Figure 2:
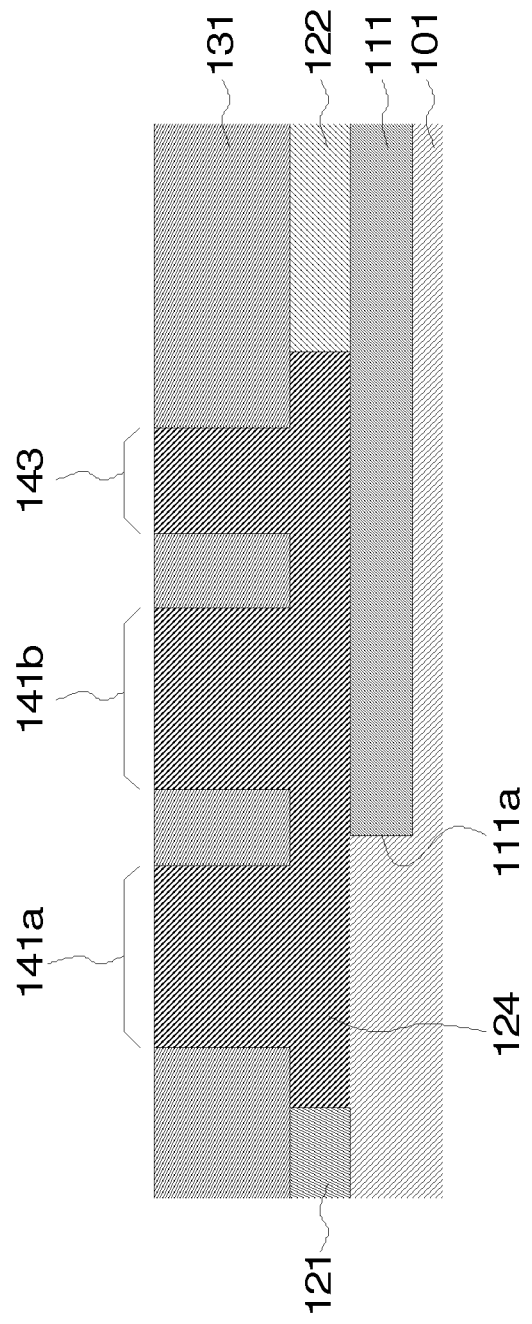
FIG. 2 is a schematic partial cross section of an N-well part in the semiconductor device shown in FIG. 1.
Figure 11:
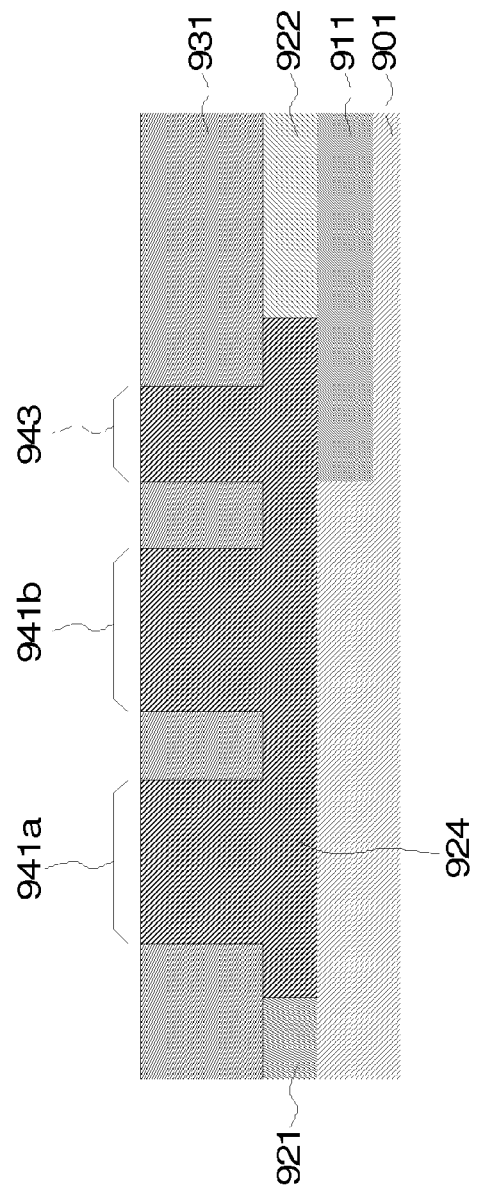
FIG. 11 is a schematic cross section along line XI-XI in FIG. 10.
Figure 12:
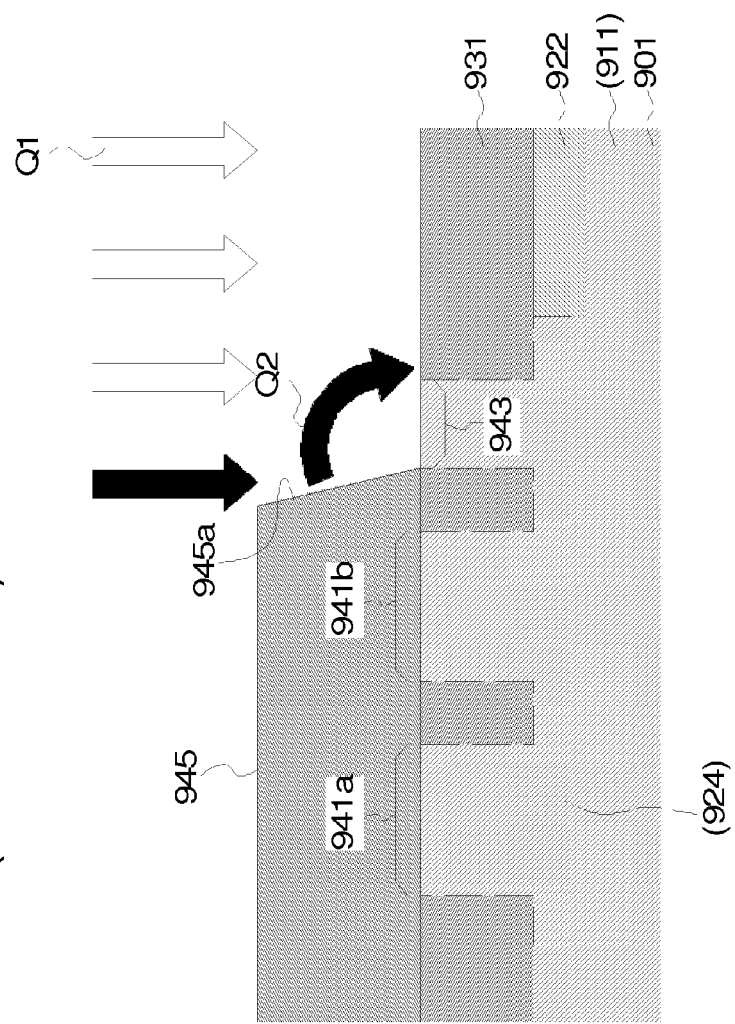
FIG. 12 is a schematic cross section for explaining a method for forming a deep N-well in the semiconductor device shown in FIG. 11.
Figure 13:
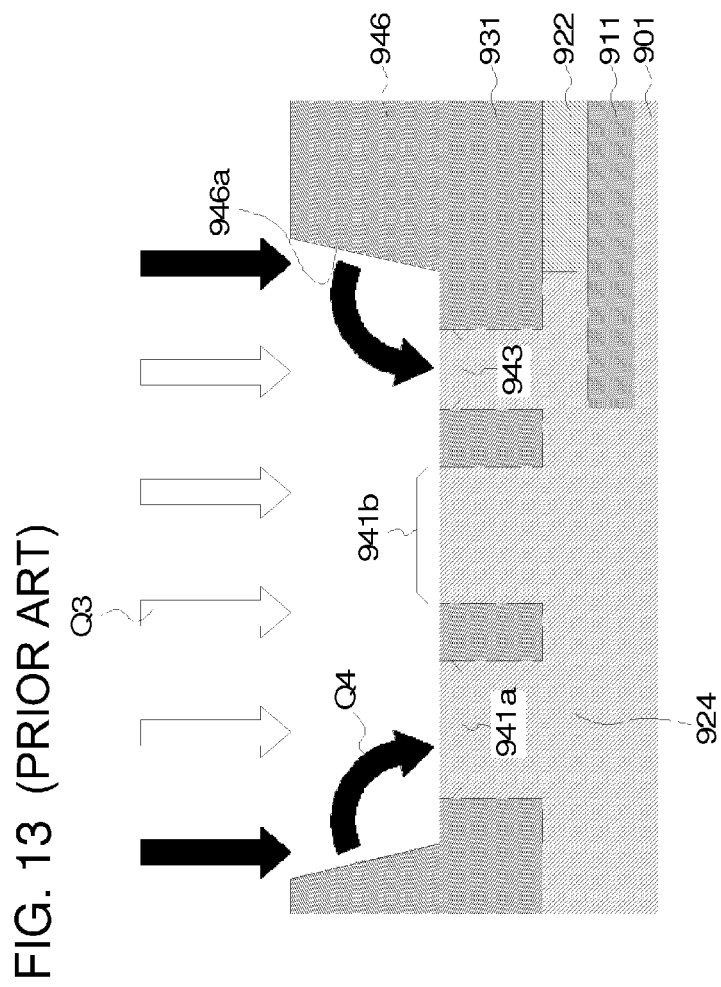
FIG. 13 is a schematic cross section for explaining a method for forming an N-well in the semiconductor device shown in FIG. 11.
Figure 14:
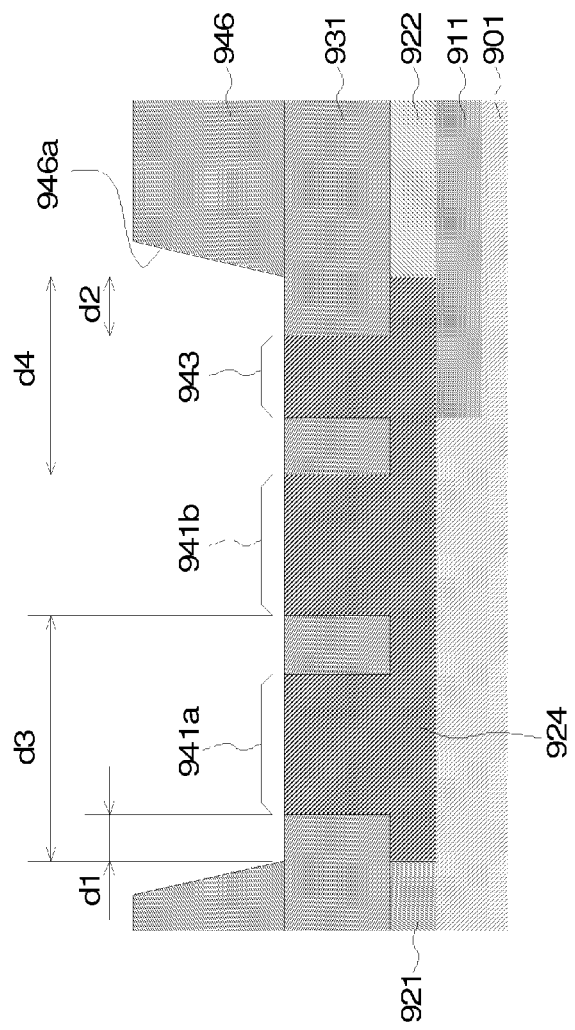
FIG. 14 is a schematic cross section after the N-well has been formed in the semiconductor device shown in FIG. 11.
Figure 15:
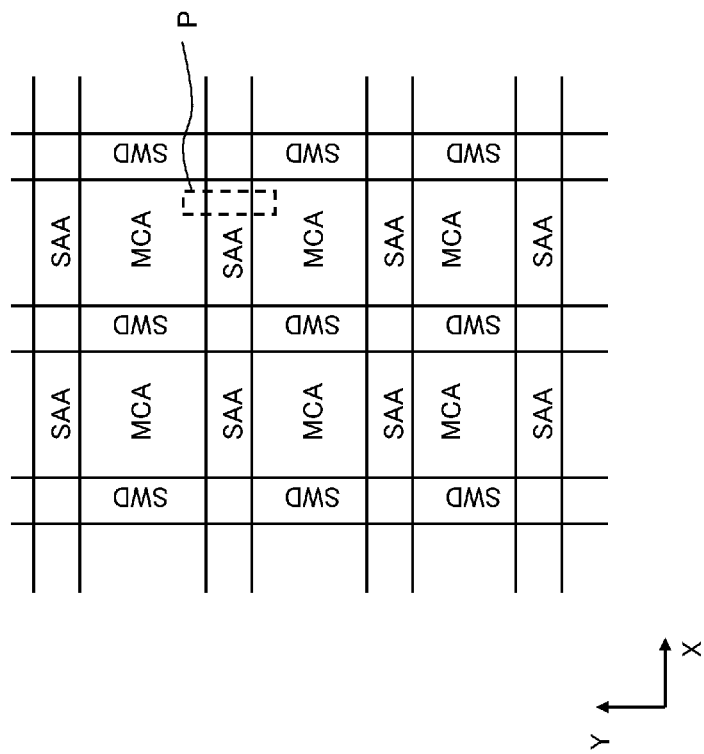
FIG. 15 is a schematic diagram illustrating the memory cell layout of a general DRAM.
Figure 16:
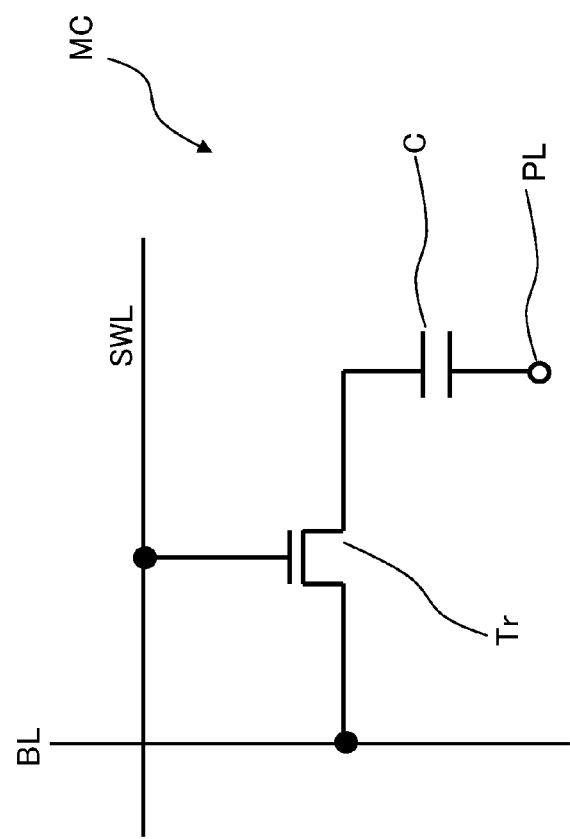
FIG. 16 shows an equivalent circuit of a memory cell.
Figure 17:
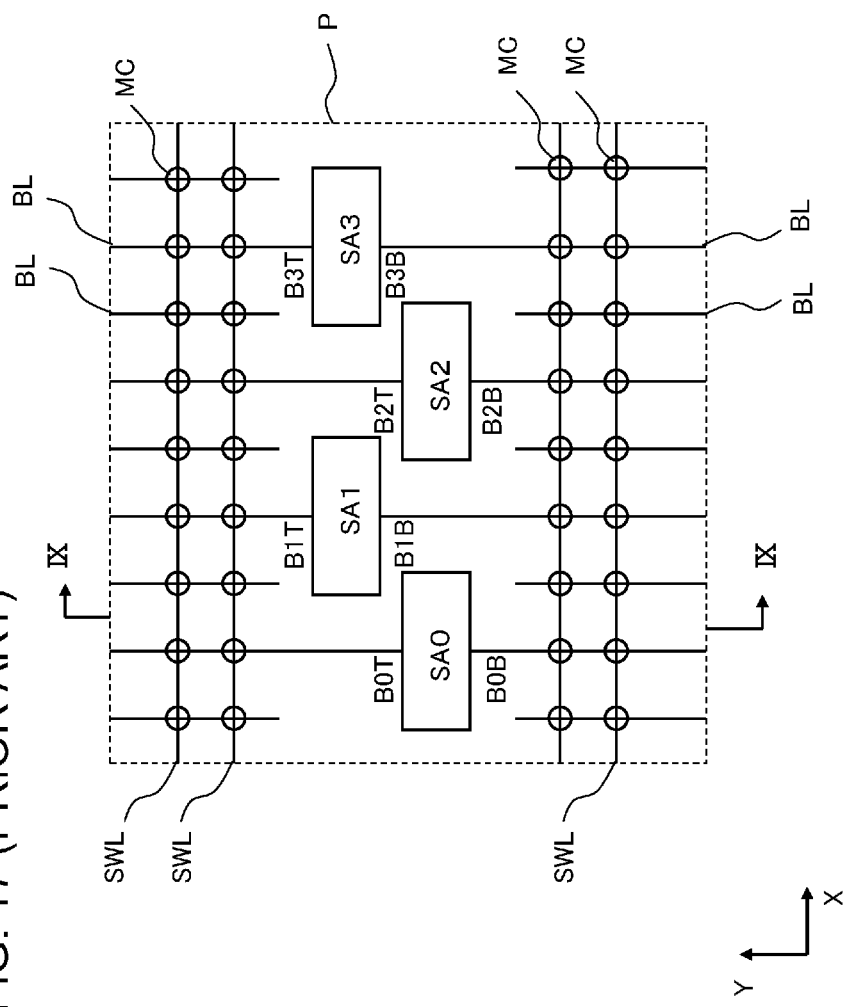
FIG. 17 is a schematic diagram of a region P including sense amplifiers shown in FIG. 15.
Figure 18:
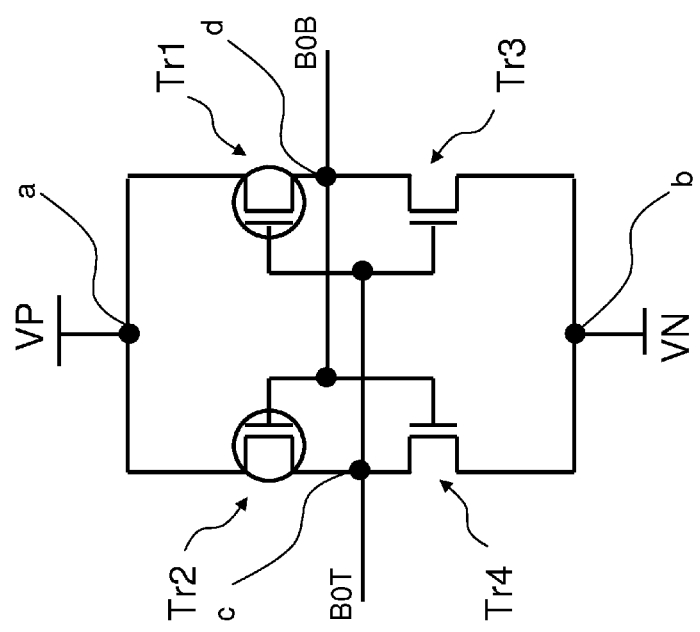
FIG. 18 is a concrete circuit configuration of a sense amplifier SA0.

FIG. 2 shows a schematic partial cross section of a N-well part in the semiconductor device shown in FIG. 1. FIG. 2 is a drawing corresponding to FIG. 11. The N-well 124 has, for instance, a first active region 141a and a second active region 141b for forming a pair of PMOSs constituting a sense amplifier circuit, and an N-well-con region 143 for connecting a contact plug for fixing potential. In FIG. 2, the N-well-con region 143, the second active region 141b, and the first active region 141a are formed in this order from the side where the deep N-well 111 is formed (the second P-well 122 side). The first active region 141a is formed closer to an outer edge (an end) of the N-well 124 than the second active region 141b. In FIG. 2, the second active region 141b is formed in the center of the N-well 124. Each region is compartmentalized by the element isolation region 131.

The deep N-well 111 extends below the entirety of the third P-well 123 and the second P-well 122 and is disposed so as to be electrically conductive to the N-well 124. Underneath the N-well 124, the deep N-well 111 extends below the N-well-con region 143 and the second active region 141b. An end (or at least a part of an end) 111a of the deep N-well 111 is located closer to the second active region 141b than to the outer edge of the N-well 124 and a left end of the first active region 141a, or more preferably, closer to a boundary between the first active region 141a and the second active region 141b. Even more preferably, the end 111a of the deep N-well 111 is located below the element isolation region 131 between the first active region 141a and the second active region 141b. In this case, a fifth distance d5 from the end 111a of the deep N-well 111 to an end of the second active region 141b is shorter than the width of the element isolation region 131 between the first active region 141a and the second active region 141b.

Except for the above, embodiments according to the first exemplary embodiment are the same as that of the semiconductor device shown in FIGS. 8 to 14.

The semiconductor device 100 of the present invention is manufactured in such a manner that the difference in ion concentration between the first active region 141a and the second active region 141b becomes even smaller. As a result, when the semiconductor device 100 has a first PMOS (not shown in FIG. 2) formed in the first active region 141a and a second PMOS (not shown in FIG. 2) formed in the second active region 141b, and has a sense amplifier circuit having the first and the second PMOSs as a pair of MOS transistors, an unbalance of the threshold voltage of the pair of PMOSs can be suppressed. As a result, a semiconductor device having a sense amplifier circuit having high operating sensitivity can be obtained.

Next, a method for manufacturing the semiconductor device 100 will be described. FIGS. 3A, 3B, 4A and 4B show schematic process diagrams for explaining the method for manufacturing the semiconductor device according to the first exemplary embodiment of the present invention. Here, the method for manufacturing the semiconductor device 100 of the present invention will be described by using an example in which the deep N-well 111 is formed first in a state in which the element isolation region 131 and the second P-well 122 have been formed, and the N-well 124 is formed thereafter. In FIGS. 3A, 3B, 4A and 4B, unformed regions are indicated by broken lines and symbols of these unformed regions are shown in parenthesis.

Figure 3A:
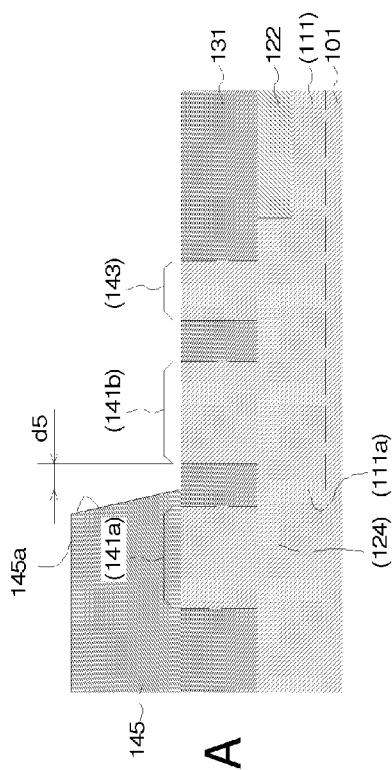
FIGS. 3A and 3B are schematic process diagrams for explaining a method for manufacturing a semiconductor device according to a first exemplary embodiment of the present invention.

The second P-well 122 is formed in the P-type semiconductor substrate 101, and the element isolation regions 131 are also formed for the first active region 141a, the second active region 141b, and the N-well-con region. First, a second photoresist film 145 is formed as a second mask on the semiconductor substrate 101 so as to expose a region where the deep N-well 111 will be formed (FIG. 3A). The second photoresist film 145 has a second opening in the region where the deep N-well 111 will be formed.

Since ion implantation to form the deep N-well 111 is performed at, for instance, between 900 keV and 1000 keV and the second photoresist film 145 is formed to be thick enough to function as a mask, a second inner wall surface (second side) 145a of the second opening of the second photoresist film 145 will be tapered with the second inner wall surface 145a facing upward. When the distance between a region where the second active region 141b will be formed and an immediate end of the opening of the second photoresist film 145 is a fifth distance d5, the fifth distance d5 is preferably set so that, when the second ion is implanted to form the deep N-well 111, the ion deflected by the second inner wall surface 145a of the second photoresist film 145 does not reach the first active region 141a. In other words, it is preferred that the second inner wall surface 145a of the second photoresist film 145 be closer to the second active region 141b than to an outer edge of the N-well 124. Further, it is preferred that the fifth distance d5 be set so that this deflected ion reaches the second active region 141b. In this case, it is preferred that the second photoresist film 145 mask a region where the first active region 141a will be formed, but not the region where the second active region 141b will be formed. For instance, it is preferred that the second inner wall surface 145a of the second photoresist film 145 lies between the first active region 141a and the second active region 141b (on the element isolation region 131). At this time, it is preferred that the fifth distance d5 be not greater than the width of the element isolation region 131 between the first active region 141a and the second active region 141b.

Figure 3B:
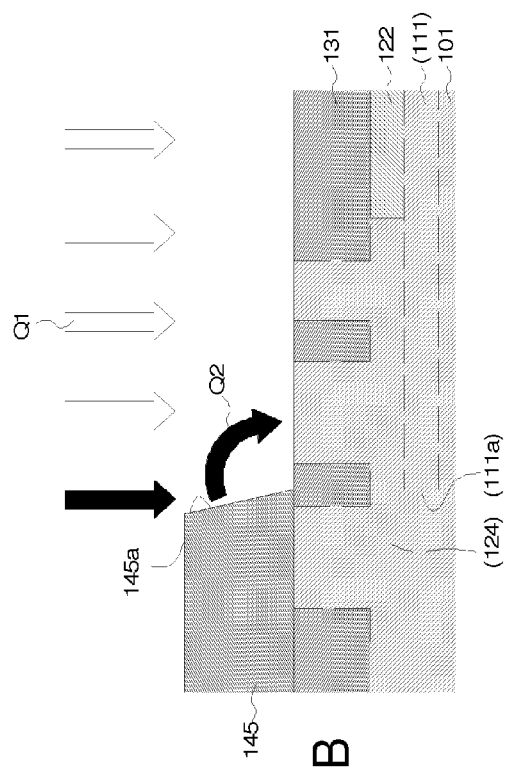

Next, the second ion Q1 and Q2 (N-type ion, for instance phosphorus ion) for forming the deep N-well 111 is implanted (FIG. 3B). The deep N-well 111 is formed by implanting the second ion Q1 (white arrows) into the second layer of the semiconductor substrate 101. When a part of an end of the second opening of the second photoresist film 145 lies between the first active region 141a and the second active region 141b, the end 111a of the deep N-well 111 is positioned below the element isolation region 131 between the first active region 141a and the second active region 141b.

Some of the second ion Q2 (black arrows) collide with the second inner wall surface 145a of the second photoresist film 145 and get deflected by the second inner wall surface 145a. The second ion Q2 deflected by the second inner wall surface 145a is supplied to the second active region 141b. However, since the energy of the second ion Q2 is lost due to the collision with the second inner wall surface 145a, the deflected ion Q2 stays near the surface of the second active region 141b. The deflected ion Q2 is not supplied to the first active region 141a.

Next, the second photoresist film 145 is removed.

Figure 4A:
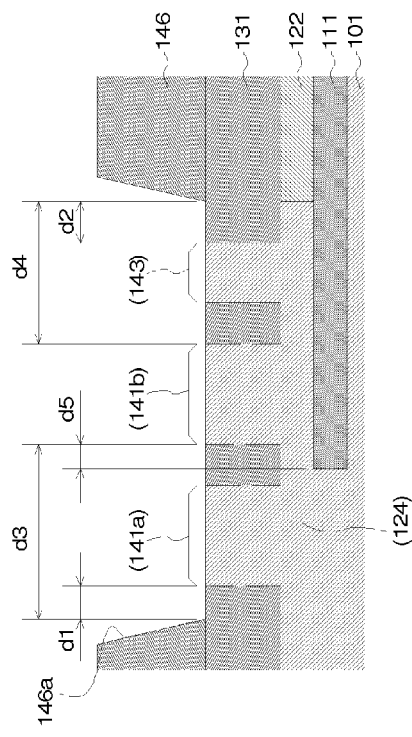
FIGS. 4A and 4B are schematic process diagrams for explaining a method for manufacturing a semiconductor device according to a first exemplary embodiment of the present invention.

Next, a first photoresist film 146 is formed on the semiconductor substrate 101, as a first mask for forming the N-well 124 (FIG. 4A). The first photoresist film 146 is formed so as to have a first opening exposing a region where the N-well 124 will be formed, i.e., exposing the first active region 141a, the second active region 141b, and the N-well-con region 143. The first opening of the first photoresist film 146 is tapered with a first inner wall surface (first side) 146a facing upward. Therefore, it is preferred that the position where the first photoresist film 146 is formed be determined so that the first ion deflected by the taper-shaped first inner wall surface 146a of the first photoresist film 146 when ion is implanted to form the deep N-well 111 reaches the first active region 141a. The first distance d1 from one of ends (an immediate end) of the first opening of the first photoresist film 146 to the first active region 141a is approximately equal to the second distance d2 from the other end (an immediate end) of the first photoresist film 146 to the N-well-con region 143. The third distance d3 from one of the ends of the first photoresist film 146 to the second active region 141b and the fourth distance d4 from the other end of the first photoresist film 146 to the second active region 141b are longer than the first distance d1 and the second distance d2. As a result, when ion is deflected by the first inner wall surface 146a of the first photoresist film 146 in this case, the deflected ion reaches the first active region 141a and the N-well-con 143, but does not reach the second active region 141b.

Figure 4B:
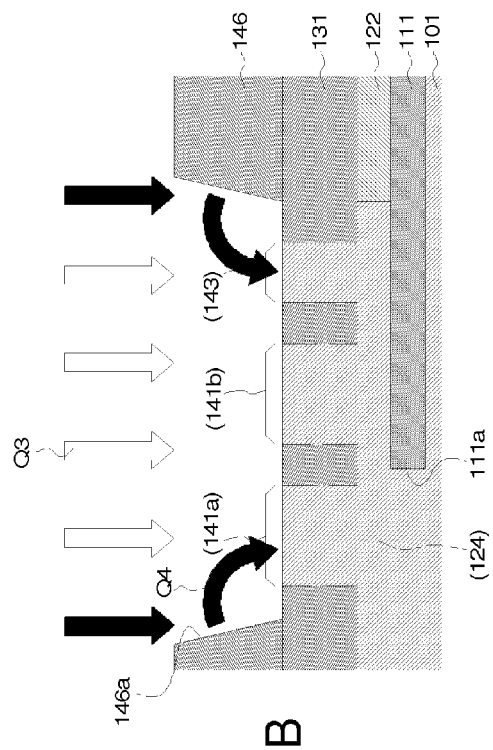

Next, the first ion Q3 and Q4 (N-type ion, for instance phosphorus ion) for forming the N-well 124 is implanted (FIG. 4B). The N-well 124 is formed by implanting the first ion Q3 (white arrows) into the first layer of the semiconductor substrate 101.

Some of the first ion Q4 (black arrows) collide with the first inner wall surface 146a of the first photoresist film 146 and get deflected by the first inner wall surface 146a. The ion Q4 deflected by the first inner wall surface 146a is supplied to the first active region 141a and the N-well-con region 143, but does not reach the second active region 141b, located far away. However, since the energy of the first ion Q4 deflected by the first inner wall surface 146a is lost due to the collision, the first ion Q4 stays near the surface of the first active region 141a.

Next, the first photoresist film 146 is removed and the semiconductor device 100 is manufactured (FIG. 2).

An example of concrete ion implantation conditions for each well is shown in Table 1.

TABLE 1

| | Ion type | Energy/keV | Dose/atoms/cm$^2$ |
|---|---|---|---|
| P-well | Boron (B) | 130 to 150 | $4 \times 10^{13}$ to $5 \times 10^{13}$ |
| N-well | Phosphorus(P) | 330 to 350 | $4 \times 10^{13}$ to $5 \times 10^{13}$ |
| Deep N-well | Phosphorus(P) | 900 to 1000 | $1 \times 10^{13}$ to $2 \times 10^{13}$ |

The ion implantation is performed in a state in which the element isolation regions 131 have already been formed in the manufacturing method described above, and the ion penetrates the element isolation regions 131 and is implanted into predetermined regions. Further, the element isolation regions 131 may be formed after the ion implantation. In other words, the process of forming the element isolation regions 131 may be performed after the N-well 124 and the deep N-well 111 have been formed. In this case, it is preferred that the positions of the deep N-well 111 and the second photoresist film 145 be aligned according to the regions where the element isolation regions 131 are scheduled to be formed (i.e., the regions where the first active region 141a and the second active region 141b are scheduled to be formed).

Figure 5:
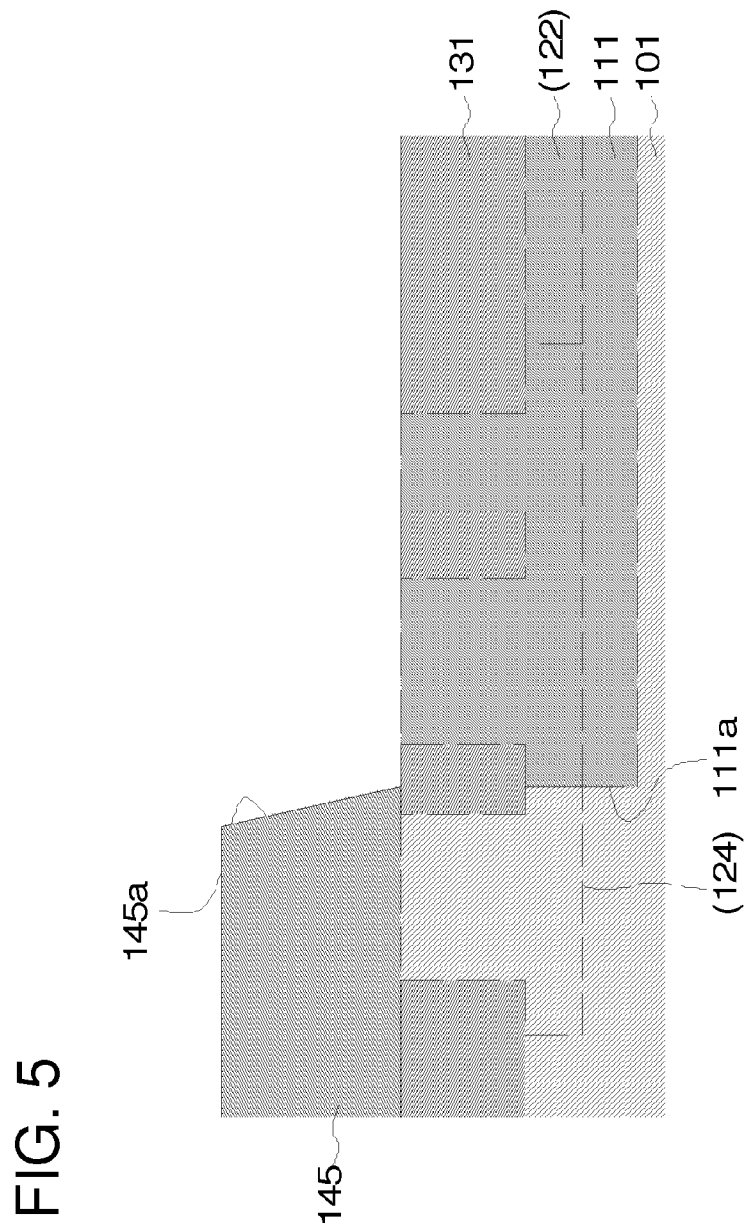
FIG. 5 is a schematic cross section of a semiconductor device in a state in which ion has been implanted to form a deep N-well first.

In the manufacturing method described above, ion is implanted to form the deep N-well 111 after the second P-well 122 has been formed, and then ion is implanted to form the N-well 124, however, the order of the ion implantation to form each well is not limited thereto. FIG. 5 shows a schematic cross section of the semiconductor device in a state in which ion has been implanted to form the deep N-well first. For instance, as shown in FIG. 5, the ion to form the deep N-well 111 may be implanted first, and the ion to form the P-wells and the N-well may be implanted thereafter. Since the N-well 124 and the P-well 122 have a higher implanted impurity concentration than the deep N-well 111, by continuously performing ion implantation after the formation of the deep N-well 111, an inverted state is created, and the N-well 124 and the P-well 122 can be formed in predetermined positions.

In the manufacturing method described above, the distances d1 and d4 between the active regions 141a and 141b of a pair of PMOSs and the outer edges of the N-well 124 are different due to the disposition of the N-well-con 143 in the SAP region, however, the factor for the fact that the first distance d1 and the fourth distance d4 are different is not limited to the disposition of the N-well-con region 143, and the present invention can be applied to embodiments in which the first distance d1 and the fourth distance d4 are different due to other factors (for instance, prevention of interference with other circuit elements disposed nearby).

In the manufacturing method of the present invention, the ion (the deflected ion) deflected by the inner wall surface (side) of the mask is supplied to the second active region 141b and the deflected ion is not supplied to the first active region 141a in the process of forming the deep N-well 111. In the process of forming the N-well 124, the deflected ion is supplied to the first active region 141a and the deflected ion is not supplied to the second active region 141b. Meanwhile, in the embodiment shown in FIG. 13, the deflected ion is supplied to neither the first active region 941a nor the second active region 941b in the process of forming the deep N-well 911. In the process of forming the N-well 924, the deflected ion is not supplied to the second active region 941b, but it is supplied to the first active region 941a. As a result, in the embodiment shown in FIG. 13, the deflected ion is supplied only to the first active region 941a, and the difference in ion concentration between the first active region 941a and the second active region 941b is large. However, according to the manufacturing method of the present invention, the deflected ion can be supplied to both the first active region 141a and the second active region 141b in one process each, and the difference in ion concentration can be reduced. This can prevent the threshold voltage difference between the MOS transistors in the first active region 141a and the second active region 141b from increasing, and for instance, the operating sensitivity of the sense amplifier circuit can be improved. Further, according to the manufacturing method of the present invention, the operating characteristics of the sense amplifier circuit can be improved just by changing the mask pattern in the process of forming the deep N-well without adding any new manufacturing process.

Figure 6:
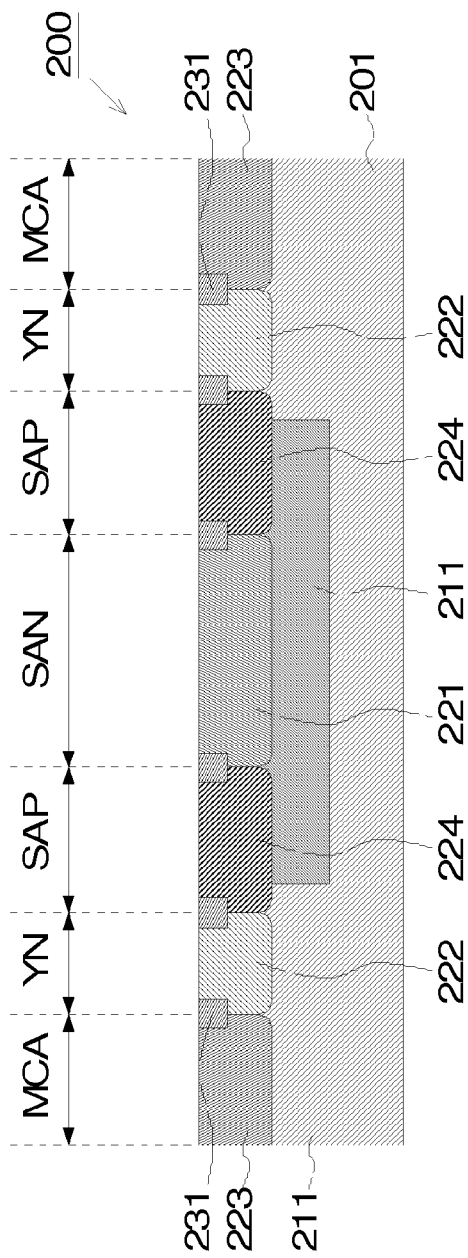
FIG. 6 is a schematic cross section of a semiconductor device according to a second exemplary embodiment of the present invention.

A semiconductor device according to a second exemplary embodiment of the present invention and a method for manufacturing the same will be described. FIG. 6 shows a schematic cross section of the semiconductor device according to the second exemplary embodiment of the present invention.

The semiconductor device 200 has a triple-well structure. The semiconductor device 200 comprises a P-type semiconductor substrate 201 and a deep N-well 211 formed in a second layer. The semiconductor device 200 further comprises a first P-well 221, a second P-well 222, a third P-well 223, and an N-well 224 formed in a first layer.

Figure 7:
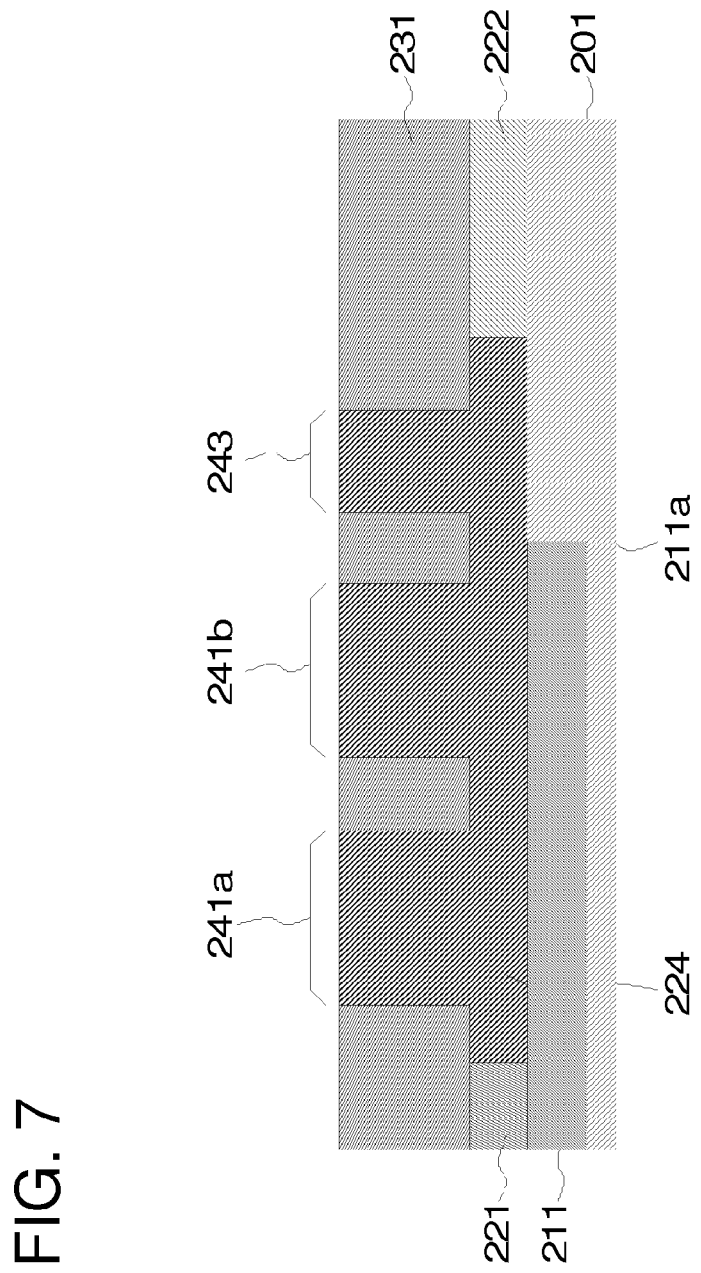
FIG. 7 is a schematic partial cross section of an N-well part in the semiconductor device shown in FIG. 6.
Figure 8:
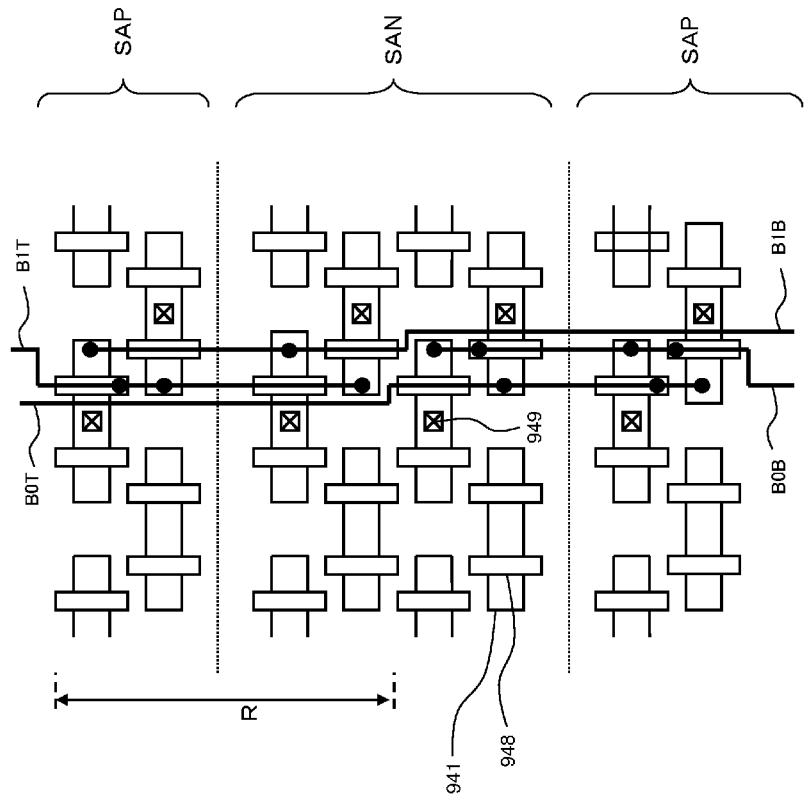
FIG. 8 is a schematic plan of a layout of MOS transistors constituting a sense amplifier.

FIG. 7 shows a schematic partial cross section of a N-well part in the semiconductor device shown in FIG. 6. The N-well 224 has, for instance, a first active region 241*a* and a second active region 241*b* for forming a pair of PMOSs constituting a sense amplifier circuit, and an N-well-con region 243 for connecting a contact plug for fixing potential. In FIG. 7, the N-well-con region 243, the second active region 241*b*, and the first active region 241*a* are formed in this order from the second P-well 222 side. The first active region 241*a* is formed closer to an outer edge (an end) of the N-well 224 than the second active region 241*b*. In FIG. 7, the second active region 241*b* is formed in the center of the N-well 224. Each region is compartmentalized by an element isolation region 231.

The deep N-well 211 extends below the entirety of the first P-well 221 and is disposed so as to be electrically conductive to the N-well 224. Underneath the N-well 224, the deep N-well 211 extends below the first active region 241*a* and the second active region 241*b*. An end (or at least a part of an end) 211*a* of the deep N-well 211 is located closer to the second active region 241*b* than to the outer edge of the N-well 224 and a right end of the N-well-con region 243, or more preferably, closer to a boundary between the second active region 241*b* and the N-well-con region 243. Even more preferably, the end 211*a* of the deep N-well 211 is located below the element isolation region 231 between the second active region 241*a* and the N-well-con region 243.

The method for manufacturing the semiconductor device 200 is the same as in the first exemplary embodiment. In other words, when the deep N-well 211 is formed, ion deflected by an inner wall surface of a photoresist film is supplied to the second active region 241*b*. When the N-well 224 is formed, ion deflected by an inner wall surface of a photoresist film is supplied to the first active region 241*a*. As a result, the deflected ion can be supplied to both the first active region 241*a* and the second active region 241*b*, and the unbalance of ion concentration can be improved.

Other modes in the second exemplary embodiment are the same as in the first exemplary embodiment, and explanation will be omitted.

In the semiconductor device and in the method for manufacturing the same, a triple-well structure may have the conductivity types opposite to those used in the above description.

An explanation of the semiconductor device and method for manufacturing the same of the present invention has been given based on the abovementioned exemplary embodiments, but there is no limitation to the abovementioned exemplary embodiments, and clearly various types of modifications, changes and improvements of the abovementioned exemplary embodiments can be included, within the ambit of the present disclosure and based on fundamental technological concepts of the disclosure. Furthermore, a wide variety combinations, substitutions, and selections of various disclosed elements (in claims, exemplary embodiments, examples and drawings) are possible within the ambit of the claims of the present disclosure.

It should be noted that other objects, features and aspects of the present invention will become apparent in the entire disclosure including the claims.

What is claimed is:

1. A method for manufacturing a semiconductor device, comprising:

forming a first mask on a semiconductor substrate, said first mask having a first opening;

forming a first layer well having first and second regions by implanting first ion into said semiconductor substrate using said first mask;

forming a second mask on said semiconductor substrate, said second mask having a second opening; and forming a second layer well located below said first layer well by implanting second ion into said semiconductor substrate using said second mask; wherein said first region is formed closer to an outer edge of said first layer well than said second region;

said first ion, deflected by a first inner wall surface of said first opening of said first mask, is supplied to said first region when said first ion is implanted; and said second ion, deflected by a second inner wall surface of said second opening of said second mask, is supplied to said second region when said second ion is implanted.

2. The method for manufacturing a semiconductor device as defined in claim 1, wherein said second layer well is formed in such a manner that at least a part of an end of said second layer well is located closer to an end of said second region than to said outer edge of said first layer well.

3. The method for manufacturing a semiconductor device as defined in claim 2, further comprising forming an element isolation region that compartmentalizes said second region from other regions on a layer in which said first layer well is formed; wherein said second layer well and said element isolation region are formed in such a manner that at least a part of said end of said second layer well is located below a region where said element isolation region is formed.

4. A method for manufacturing a semiconductor device, comprising:

forming a first mask on a semiconductor substrate, said first mask having a first opening;

forming a first layer well having first and second regions used to form a pair of MOS transistors by implanting first ion into said semiconductor substrate using said first mask as a mask;

forming a second mask on said semiconductor substrate, said second mask having a second opening; and forming a second layer well located below said first layer well by implanting second ion into said semiconductor substrate using said second mask as a mask; wherein said first mask is formed in such a manner that said first ion, deflected by a first inner wall surface of said first opening of said first mask, is supplied to said first region; and said second mask is formed in such a manner that said second ion, deflected by a second inner wall surface of said second opening of said second mask, is supplied to said second region.

5. The method for manufacturing a semiconductor device as defined in claim 4, wherein said first region is formed closer to an outer edge of said first layer well than said second region.

6. The method for manufacturing a semiconductor device as defined in claim 4, wherein said second mask is formed in such a manner that at least a part of said second inner wall surface of said second mask is located closer to an end of said second region than an outer edge of said first layer well.

7. The method for manufacturing a semiconductor device as defined in claim 4, further comprising forming an element isolation region that compartmentalizes said second region from other regions on a layer in which said first layer well is formed; wherein said second mask and said element isolation region are formed in such a manner that at least a part of said second inner wall surface of said second mask is located in a region where said element isolation region is formed.

8. The method for manufacturing a semiconductor device as defined in claim 4, wherein
said second mask is formed so as to cover said first region.

9. The method for manufacturing a semiconductor device as defined in claim 4, wherein
said first inner wall surface of said first opening of said first mask is tapered, facing upward.

10. The method for manufacturing a semiconductor device as defined in claim 4, wherein
said second inner wall surface of said second opening of said second mask is tapered, facing upward.

11. The method for manufacturing a semiconductor device as defined in claim 4, further comprising:
forming a first MOS transistor in said first region;
forming a second MOS transistor in said second region; and
forming a sense amplifier circuit having said first MOS transistor and said second transistor as a pair of MOS transistors.

12. The method for manufacturing a semiconductor device as defined in claim 4, wherein said first ion and said second ion are the same ion.

13. A method for manufacturing a semiconductor device, comprising:
providing a semiconductor substrate having a first, a second and a third regions, said first, said second and said third regions arranged in that order on a line;
forming a first mask on said semiconductor substrate, said first mask having a first opening;
implanting first ion into said first, said second and said third regions to form a first layer well using said first mask, so that said first and said third regions also include said first ion deflected by a first inner wall surface of said first opening of said first mask;
forming a second mask on said semiconductor substrate, said second mask having a second opening; and
implanting second ion into said second and third regions to form a second layer well using said second mask, so that said second region also includes said second ion deflected by a second inner wall surface of said second opening of said second mask.

14. The method for manufacturing a semiconductor device as defined in claim 13, wherein
said first region is formed closer to an outer edge of said first layer well than said second region.

15. The method for manufacturing a semiconductor device as defined in claim 13, wherein
said third region is formed closer to an outer edge of said first layer well than said second region.

16. The method for manufacturing a semiconductor device as defined in claim 13, wherein
said second mask is formed in such a manner that at least a part of said second inner wall surface of said second mask is located closer to an end of said second region than an outer edge of said first layer well.

17. The method for manufacturing a semiconductor device as defined in claim 13, further comprising forming an element isolation region that compartmentalizes said second region from other regions on a layer in which said first layer well is formed; wherein
said second mask and said element isolation region are formed in such a manner that at least a part of said second inner wall surface of said second mask is located in a region where said element isolation region is formed.

18. The method for manufacturing a semiconductor device as defined in claim 13, wherein
said first inner wall surface of said first opening of said first mask is tapered, facing upward.

19. The method for manufacturing a semiconductor device as defined in claim 13, wherein
said second inner wall surface of said second opening of said second mask is tapered, facing upward.

20. The method for manufacturing a semiconductor device as defined in claim 13, further comprising:
forming a first MOS transistor in said first region;
forming a second MOS transistor in said second region;
forming a sense amplifier circuit having said first MOS transistor and said second transistor as a pair of MOS transistors; and
forming a contact plug for fixing potential in said third region.

* * * * *